United States Patent
Ahmed et al.

(10) Patent No.: US 11,671,103 B2
(45) Date of Patent: *Jun. 6, 2023

(54) INTEGRATION OF ANALOG CIRCUITS INSIDE DIGITAL BLOCKS

(71) Applicant: Apple Inc., Cupertino, CA (US)

(72) Inventors: Ramy A. Ahmed, Cupertino, CA (US); Bruno W. Garlepp, Sunnyvale, CA (US); Jafar Savoj, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/571,228

(22) Filed: Jan. 7, 2022

(65) Prior Publication Data

US 2022/0216874 A1 Jul. 7, 2022

Related U.S. Application Data

(63) Continuation of application No. 16/796,405, filed on Feb. 20, 2020, now Pat. No. 11,258,447.

(51) Int. Cl.
*H03K 21/00* (2006.01)
*H03K 21/40* (2006.01)
(Continued)

(52) U.S. Cl.
CPC ......... *H03K 21/403* (2013.01); *H03K 3/0315* (2013.01); *H03K 19/017509* (2013.01); *H03K 21/08* (2013.01)

(58) Field of Classification Search
CPC ............... H03K 21/403; H03K 3/0315; H03K 19/017509; H03K 21/08
See application file for complete search history.

(56) References Cited

U.S. PATENT DOCUMENTS 7,940,139 B2    5/2011    Kodama
8,710,913 B2    4/2014    Baumann et al.
(Continued)

FOREIGN PATENT DOCUMENTS

WO    2017/120242 A1    7/2017

OTHER PUBLICATIONS

Gu-Yeon Wei and Mark Horowitz, A Low Power Switching Power Supply for Self-Clocked Systems, Computer Systems Laboratory, Stanford University, CA 94305, Conference Paper • Sep. 1996 DOI: 10.1109/LPE.1996.547531 • Source: IEEE Xplore, https://www.researchgate.net/publication/3657755, 6 pages.

(Continued)

*Primary Examiner* — Tuan T Lam
(74) *Attorney, Agent, or Firm* — Kowert, Hood, Munyon, Rankin & Goetzel, P.C.; Gareth M. Sampson

(57) ABSTRACT

A circuit for sensing local operating properties of an integrated circuit is disclosed. The circuit may include one or more sensor circuits configured to sense the local operating properties of the integrated circuit. The sensor circuits may receive a supply voltage with a magnitude in a limited range from a digital power supply that is different from the digital power supply that provides power to functional circuits in the integrated circuit. Level shifters may be coupled to the sensor circuits to shift output signals from the sensor circuits to levels that correspond to the digital power supply that provides power to functional circuits in the integrated circuit. Counters and a shift register may be coupled to the level shifters to receive the shifted output signals, the values of which may be used to determine the local operating properties of the integrated circuit as sensed by the sensor circuits.

20 Claims, 5 Drawing Sheets

(51) Int. Cl.
  *H03K 3/03* (2006.01)
  *H03K 19/0175* (2006.01)
  *H03K 21/08* (2006.01)

(56) References Cited

U.S. PATENT DOCUMENTS

| | | |
|---|---|---|
| 9,467,041 B2 | 10/2016 | Yang et al. |
| 9,742,419 B2 | 8/2017 | Okamoto et al. |
| 2004/0037346 A1* | 2/2004 | Rusu .................. G06F 1/3296 374/E7.042 |
| 2008/0278223 A1 | 11/2008 | Kernahan |
| 2012/0075005 A1 | 3/2012 | Flores |
| 2014/0145707 A1 | 5/2014 | Tanabe |
| 2014/0294042 A1 | 10/2014 | Bruset |
| 2018/0095115 A1 | 4/2018 | Fukuoka et al. |
| 2018/0310087 A1 | 10/2018 | Buffa |
| 2018/0316355 A1* | 11/2018 | Yamamoto ............. H03L 1/02 |

OTHER PUBLICATIONS

ISR-WO, PCT/US2021/018600, dated Jun. 1, 2021, 24 pages.
Huang Qiwei et al: 11 An Energy-Efficient Frequency-Domain CMOS Temperature Sensor With Switched Vernier Time-to-Digital Conversion 11,IEEE Sensors Journal, IEEE Service Center, New York, NY, US, vol. 17, No. 10, May 15, 2017 (May 15, 2017), pp. 3001-3011, XP011647026, ISSN: 1530-437X, DOI: 10.1109/JSEN. 2017.2686442 [retrieved on Apr. 20, 2017] the whole document.
Sung-Sik Woo et al: 11 A ring oscillator-based temeerature sensor for U-healthcare in 0.13A CMOS, SOC Design Conference (ISOCC), 2009 International, IEEE, Piscataway, NJ, USA, Nov. 22, 2009 (Nov. 22, 2009), pp. 548-551, XP031670774, ISBN: 978-1-4244-5034-3-the whole document.
Lash Kare Sandip et al: 11 A Compact PrMnO3 Based Oscillator as an Alternative to CMOS Ring Oscillator in a Smart Temperature Sensor, 2018 IEEE Sensors, IEEE, Oct. 28, 2018 (Oct. 28, 2018), pp. 1-4, XP033477307, DOI: 10.1109/ICSENS.2018.8589573 [retrieved on Dec. 26, 2018] the whole document.

* cited by examiner

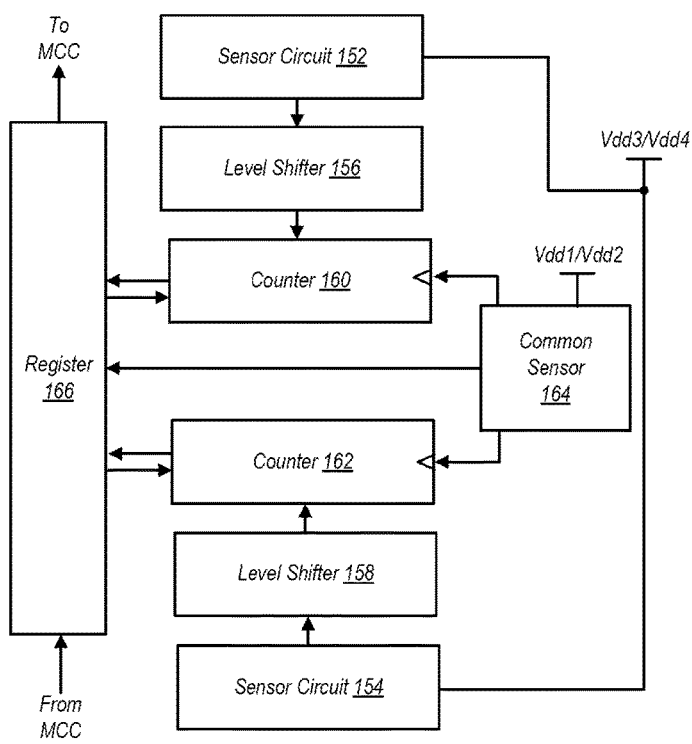
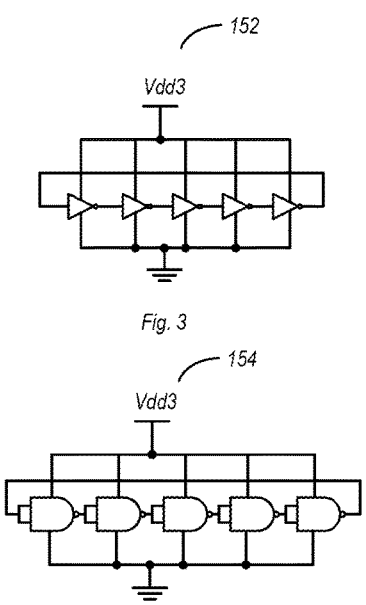
Fig. 2
Fig. 3
Fig. 4

600 ─┐

```
┌─────────────────────────────────────────────────────────┐
│ A first supply voltage from a first digital power supply │
│ is received at a first sensor circuit where the first    │
│ digital power supply provides the first supply voltage   │
│ at a supply voltage with a magnitude in a limited range  │
│ and where the first sensor circuit produces an output    │
│ signal responsive to a value of a first local operating  │
│ property                                                 │
│                          602                             │
└─────────────────────────────────────────────────────────┘
                            │
                            ▼
┌─────────────────────────────────────────────────────────┐
│ A level of the output signal is shifted using a first    │
│ level shifter coupled to the first sensor circuit where  │
│ the shifted output signal is shifted corresponding to a  │
│ second supply voltage provided by a second digital       │
│ power supply                                             │
│                          604                             │
└─────────────────────────────────────────────────────────┘
                            │
                            ▼
┌─────────────────────────────────────────────────────────┐
│ The shifted output signal is received at a first counter │
│ coupled to the first level shifter                       │
│                          606                             │
└─────────────────────────────────────────────────────────┘
                            │
                            ▼
┌─────────────────────────────────────────────────────────┐
│ A first value representing the shifted output signal is  │
│ determined by the first counter                          │
│                          608                             │
└─────────────────────────────────────────────────────────┘
```

Fig. 6

INTEGRATION OF ANALOG CIRCUITS INSIDE DIGITAL BLOCKS

This application is a continuation of U.S. patent application Ser. No. 16/796,405 filed on Feb. 20, 2020. The above application is incorporated herein by reference in its entirety. To the extent that any incorporate material conflicts with material expressly set forth herein, the expressly set forth material controls.

BACKGROUND

Technical Field

Embodiments described herein relate to electronic circuits. More particularly, embodiments described herein relate to electronic circuits used to sense local voltages and temperatures for an integrated circuit.

Description of the Related Art

As features sizes have decreased, the number of transistors on integrated circuits (ICs) has correspondingly increased. The increased number of transistors per unit area has resulted in a corresponding increase in thermal output of ICs. Furthermore, the increased number of transistors per unit area has also corresponded to a decrease in the supply voltages provided to various functional circuitry on an IC. This has in turn led to significant challenges in balancing performance, power consumption, and thermal output of ICs. To this end, many ICs implement subsystems that monitor various metrics of the IC (e.g., temperature, voltage, voltage drops) and adjust the performance based on received measurements. For example, a control subsystem may reduce a clock frequency, supply voltage, or both, responsive to a temperature reading that exceeds a predefined threshold. This may help maintain operation of the IC within specified thermal limits. Such control systems may also boost the performance of certain functional circuits when measured metrics are well within limits.

IC subsystems used to control performance based on system metrics typically include one or more sensors and at least one control system. In some systems, the sensors may be coupled to receive a power supply from a source separate to other circuitry in the vicinity (e.g., a tightly controlled analog power supply). Using an analog power supply for the sensors, however, may necessitate complex metrology to integrate and couple the analog power supply to analog elements in a digital circuit block. In some systems the use of digital power supplies associated with processing units in the digital circuit block to provide supply voltages to the sensors has been contemplated. In such systems, variations in the supply voltages and low supply voltage levels provided to the sensors may reduce the accuracy and performance of the sensors.

SUMMARY

An analog sensor circuit may be integrated inside a digital functional circuit block using digital power supplies for the oscillators. The analog sensor circuit may include ring oscillators to sense local operating properties of the digital functional circuit block. In certain embodiments, a substantially fixed or limited range supply voltage (e.g., a SRAM memory power supply) is used for sensor circuits within the digital functional circuit block. Using the substantially fixed or limited range supply voltage, the sensors may provide more accurate measurement of local operating properties (e.g., voltage, temperature, or current). Level shifters may be coupled to the sensor circuits to shift levels of the output signals from the sensor circuits to levels that correspond to the supply voltage provided to the digital functional circuit block.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 2 depicts a diagram illustrating an embodiment of sensor.

FIG. 3 depicts a diagram illustrating an embodiment of a sensor circuit that implements series-coupled inverters.

FIG. 4 depicts a diagram illustrating an embodiment of a sensor circuit that implements series-coupled NAND gates.

FIG. 6 is a flow diagram illustrating a method for determining a voltage and a temperature from a sensor, according to some embodiments.

Figure 1:
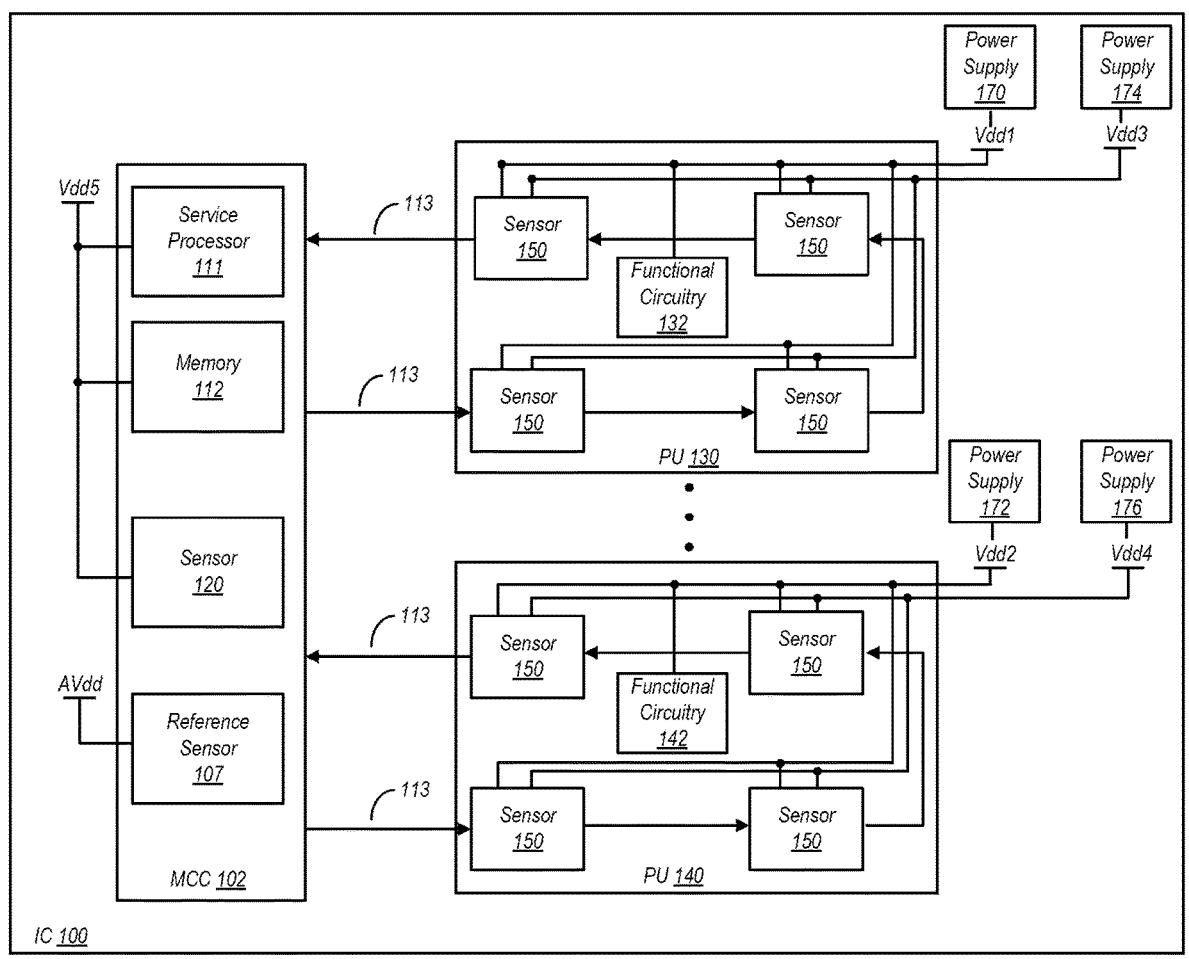
FIG. 1 depicts a block diagram of an embodiment of an integrated circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform sonic task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it).

Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 depicts a block diagram of an embodiment of an integrated circuit (IC). In the embodiment shown, IC 100 includes two functional circuit blocks, processing unit (PU) 130, and PU 140. In various embodiments, other functional circuit blocks may be included, including additional instances of PU 130 or PU 140. PU 130 and PU 140 are thus shown here as exemplary functional circuit blocks, but are not intended to limit the scope of this disclosure. Each of PU 130 and 140 may be a general purpose processor core, a central processing unit (CPU), a graphics processing unit (GPU), a digital signal processing unit, or virtually any other kind of functional unit/circuitry configured to perform a processing function. The scope of this disclosure may apply to any of these types of functional circuit blocks, as well as others not explicitly mentioned herein. The number of functional circuit blocks shown here is by way of example as well, as the disclosure is not limited to any particular number.

In certain embodiments, PU 130 is a general purpose processor core configured to execute the instructions of an instruction set and perform general purpose processing operations. Functional circuitry 132 of PU 130 may thus include various types of circuitry such as execution units of various types (integer, floating point, etc.), register files, schedulers, instruction fetch units, various levels of cache memory, and other circuitry that may be implemented in a processor core.

In certain embodiments, functional circuitry 132 in PU 130 is coupled to receive first supply voltage Vdd1 from power supply 170. Power supply 170 may be a digital power supply such as a processing unit power supply. It is noted however that multiple power domains, and thus multiple supply voltages, may be implemented within various embodiments of PU 130 and functional circuitry 132, as described herein. Furthermore, supply voltages provided to PU 130 and functional circuitry 132 may be variable under the control of power management circuitry (not shown). The power management circuitry adjusts the voltages for various reasons, such as controlling performance levels, thermal output, and power consumption.

In certain embodiments, PU 140 includes functional circuitry 142, which may implement various types of graphics processing circuitry such that PU 140 is a GPU. This may include graphics processing cores, various types of memory and registers, and so on. In some embodiments, functional circuitry 142 in PU 140 is coupled to receive a second supply voltage, Vdd2, from power supply 172. Power supply 172 may be a digital power supply such as a processing unit power supply. Power supply 172 and second supply voltage Vdd2 may be separate from power supply 170 and first supply voltage Vdd1.

In certain embodiments, both PU 130 and PU 140 include a number of sensors 150. The particular number of sensors 150 shown here is for example only, and in actual embodiments may be greater, lesser, or equal. Sensors 150 may be configured for sensing one or more operating properties of PU 130 or PU 140 (e.g., performance metrics or parameters of the processing units). In certain embodiments, sensors 150 are configured to sense operating voltage or operating temperature values (e.g., local operating voltage or operating temperature values for PU 130 and/or PU 140). The sensed voltage and temperature values may in turn be used to determine whether or not circuitry implemented therein (e.g., functional circuitry 132 or functional circuitry 142) is operating within limits and/or is capable of higher performance. In some embodiments, sensors 150 are configured to sense other local operating values such as, but not limited to, current.

In certain embodiments, sensors 150 are coupled to the same power supply as the functional circuitry in its respective functional circuit block along with an additional power supply. For example, as shown in FIG. 1, sensors 150 in PU 130 are coupled to power supply 170, which provides supply voltage Vdd1, along with power supply 174, which provides supply voltage Vdd3. Correspondingly, sensors 150 in PU 140 are coupled to power supply 172, which provides supply voltage Vdd2, along with power supply 176, which provides supply voltage Vdd4. Thus, sensors 150 may receive multiple supply voltages that are utilized by the sensors as described herein.

As described above, power supply 170 and power supply 172 may be processing unit power supplies (e.g., power supplies for CPUs or GPUs). Processing unit power supplies may provide supply voltages that vary from power supply to power supply. The variations may be due to, for example, binning to different values of voltages in different power supplies or for binning for different operations of the processing unit receiving the supply voltage. These processing unit power supplies may also experience changes in supply voltages due to DVFM (dynamic voltage and frequency management) state changes. These variations in voltage may reduce the accuracy of operating property sensing using analog circuit elements in sensors 150. Additionally, processing unit power supplies may provide low supply voltages that reduce the accuracy of operating property sensing using the analog circuit elements in sensors 150.

In certain embodiments, as shown in FIG. 1, power supply 174 and power supply 176 provide a digital power supply voltage with a magnitude of the supply voltage being in a limited range. For example, power supply 174 and power supply 176 may be fixed digital power supplies, limited range digital power supplies, or a combination thereof (e.g., one is a fixed digital power supply and the other is a limited range digital power supply). A fixed digital power supply may be a power supply that provides a supply voltage with a substantially fixed magnitude to sensors 150. The substantially fixed supply voltage may be a voltage that is fixed at a selected voltage level while there may be some operational variation in voltage around the fixed selected voltage level (e.g., about ±10%) such that the voltage provided is limited in range. A limited range digital power supply may be a power supply that provides a voltage with a magnitude that can vary over a small range (e.g., between about ±10% and about ±25%).

In some embodiments, a fixed digital power supply or a limited range digital power supply may provide a voltage with a magnitude that remains above a minimum voltage magnitude (e.g., the voltage is not a low supply voltage as described above). For example, the power supply may provide a minimum voltage magnitude selected to ensure a desired accuracy for operating property sensing using the analog circuit elements in sensors 150. The minimum voltage magnitude selected may vary depending on the operating parameters of sensors 150 and/or operating properties of IC 100, PU 130, and/or PU 140. Examples of minimum voltage magnitudes that may be selected include, but are not limited to, 600 millivolts, 750 millivolts, and 1000 millivolts The digital supply voltage with a magnitude in the limited range may be provided to analog circuit elements in sensors 150, described below, to provide more accurate sensing of local operating properties. For example, power supply 174 and power supply 176 may be digital power supplies that do not experience binning voltage changes or DVFM voltage changes that are associated with processing unit power supplies. Power supply 174 and power supply 176 may be, in some embodiments, power supplies that provide supply voltages to SRAM memory units (not shown) or other functional circuitry blocks that utilize fixed or limited range supply voltages in IC 100. Power supplies for SRAM memory units and other fixed digital supply rails or limited range supply rails may be ubiquitous in large digital integrated circuits. Thus, supply voltages from these supplies may be routed to sensors 150 in PU 130 and/or PU 140 with small electrical resistances.

In some embodiments, Vdd3 and Vdd4 are the same supply voltage. For example, power supply 174 and power supply 176 may provide the same supply voltage, or power supply 174 and power supply 176 may be a single power supply that provides the supply voltage to sensors 150 in both PU 130 and PU 140.

FIG. 2 depicts a diagram illustrating an embodiment of sensor 150. In certain embodiments, sensor 150 includes sensor circuit 152 and sensor circuit 154. The particular number of sensor circuits in sensors 150 may, however, vary. Sensor circuits 152, 154 may include one or more elements that operate to sense one or more operating properties of a functional circuit block in which sensor 150 is positioned. For example, sensor circuits 152, 154 may sense operating voltage, operating temperature, or operating current of the functional circuit block. In some embodiments, sensor circuit 152 and sensor circuit 154 sense different operating properties. For example, sensor circuit 152 may sense operating voltage while sensor circuit 154 senses operating temperature.

In some embodiments, sensor circuit 152 and sensor circuit 154 include ring oscillators. Ring oscillators may be implemented using inverters, NAND gates, other types of inverting circuitry, and various combinations thereof. FIG. 3 depicts a diagram illustrating an embodiment of sensor circuit 152 that implements series-coupled inverters. FIG. 4 depicts a diagram illustrating an embodiment of sensor circuit 154 that implements series-coupled NAND gates.

In certain embodiments, as shown in FIG. 2, both sensor circuit 152 and sensor circuit 154 receive the same supply voltage (e.g., Vdd3 for sensor 150 positioned in PU 130 or Vdd4 for sensor 150 positioned in PU 140). Sensor circuit 152 and sensor circuit 154 may be provided the same supply voltage as the sensor circuits are located in close proximity to one another. Though sensor circuit 152 and sensor circuit 154 receive the same supply voltage, the sensor circuits may have different circuit implementations (e.g., different ring oscillator implementations) to sense different operating properties. For example, sensor circuit 152 may include a ring oscillator that oscillates at a different frequency from a ring oscillator in sensor circuit 154 under identical operating conditions. Thus, in accordance with discussion below, this may enable the respective frequencies produced by the ring oscillators in sensor circuit 152 and sensor circuit 154 to be the basis for solving for voltage and temperature at sensor 150.

Providing the supply voltage to sensor circuit 152 and sensor circuit 154 from a fixed digital power supply or a limited range digital power supply (e.g., power supply 174 or power supply 176, as described above) may provide advantages in sensing local operating properties with the sensor circuits. For example, with the fixed or limited range supply voltage, analog circuit elements, such as ring oscillators, in sensor circuits 152, 154 are not subject to variations in voltage and/or low voltages that can decrease performance and reduce the accuracy of the analog circuit elements (e.g., if the sensor circuits receive power from processing unit power supplies such as power supply 170 or power supply 172). Thus, providing the fixed or limited supply voltage may allow the analog circuit elements in sensor circuits 152 and 154 to operate with high-performance capability and provide improved accuracy in sensing local operating properties.

In certain embodiments, sensor circuit 152 is coupled to level shifter 156 and sensor circuit 154 is coupled to level shifter 158. Sensor circuits 152 and 154 may output signals that are responsive to values of the local operating properties being sensed by the sensor circuits. Level shifters 156 and 158 may shift the levels of the output signals received from sensor circuits 152 and 154 and provide shifted output signals to counters 160 and 162, respectively. The levels of the output signal from sensor circuits 152 and 154 may be shifted by level shifters 156 and 158 to change the output signal to correspond to supply voltages for additional components (e.g., counters 160 and 162) in sensor 150, as described below.

In certain embodiments, counters 160 and 162 are coupled to common sensor 164. Common sensor 164 may be, for example, a local aging sensor. In some embodiments, common sensor 164, during operation, generates and provides a local clock signal to each of counters 160 and 162 as well as to register 166. The local clock signal may be used by each of counters 160 and 162 as a timer that tracks a run time for allowing the counters to accumulate a count during a measurement. In some embodiments, common sensor 164 (which may be a free running oscillator in one embodiment) may be less sensitive to voltage and temperature variations than either one of sensor circuits 152 and 154. With regard to the particular circuit topology, common sensor 164 may be, for example, a ring oscillator implemented using inverters, NAND gates, other types of inverting circuitry, and various combinations thereof. Various parameters of the transistors used in implementing the circuitry may also be varied to achieve the desired sensitivities of common sensor 164. In some embodiments, common sensor 164 may be substantially independent of voltage and temperature variations, and more generally, may be less sensitive to these variations than either of the other sensor circuits 152 and 154.

In some embodiments, common sensor 164 is coupled to provide the local clock signal to counters 160 and 162 within sensor 150. Other embodiments are also contemplated in which a separate clock signal is provided to each counter. Although one embodiment of a clock circuit in sensor 150 is implemented using common sensor 164, it is noted that other types of circuits capable of generating a clock signal may be used in other embodiments. Generally speaking, any type of circuit suitable for generating a periodic signal suitable for use as a clock signal can be used to implement a local clock circuit in various embodiments of sensor 150. In some embodiments, common sensor 164 does not provide a clock signal to any circuit external to sensor 150. Furthermore, in some embodiments, none of the circuits in sensor 150 are coupled to receive a clock signal from any source external to the sensor. With respect to its physical location, common sensor 164 may be implemented on IC 100 (or more generally on an IC) in close proximity to the other circuitry of sensor 150.

In certain embodiments, as shown in FIG. 2, common sensor 164 may receive supply voltage Vdd1 (or Vdd2 depending on the processing unit). Thus, common sensor 164 may receive the supply voltage that corresponds to the supply voltage received in the functional circuitry in the processing unit (e.g., functional circuitry 132 in PU 130 or functional circuitry 142 in PU 140). In such embodiments, level shifters 156 and 158 are used to shift the output signals from sensor circuits 152 and 154, respectively, to levels that correspond to Vdd1 for sensors in PU 130 (or Vdd2 for sensors in PU 140). Shifting the levels of the output signals using level shifters 156 and 158 allows the logic coupled to common sensor 164 and Vdd1/Vdd2 (e.g., counters 160 and 162 and register 166) to track signals corresponding to the sensed local operating properties.

During the taking of a measurement of local operating properties, counters 160 and 162 may receive the shifted output signals from level shifters 156 and 158, respectively, to track one or more count values for sensor circuits 152 and 154, respectively. The count values in counters 160 and 162 may in turn indicate the frequencies produced by ring oscillators (or other sensing elements) in sensor circuits 152 and 154, respectively. The respective count values received by counters 160 and 162 may be the basis for solving for operating properties (e.g., voltage and temperature) at sensor 150.

In addition to having different circuit implementations (e.g., different ring oscillator implementations), as described above, sensor circuits 152 and 154 may be designed to have different relationships to voltage and temperature with respect to one another. For example, in some embodiments, one of sensor circuit 152 or sensor circuit 154 may be designed such that the frequency of its output signal is more sensitive to variations in voltage than the other one. Similarly, the other one of sensor circuit 152 or sensor circuit 154 may be designed such that the frequency of its output signal is more sensitive to variations in temperature than the other one. For the sensor circuit more sensitive to variations in voltage, the frequency of the output signal of the voltage sensitive sensor circuit (e.g., ring oscillator) may be more strongly dependent on voltage, with the voltage frequency being a function of a large and linear voltage slope while its relationship to temperature may be non-linear. Similarly, for the sensor circuit that is more sensitive to temperature, the frequency of the output signal of the temperature sensitive sensor circuit (e.g., ring oscillator) may be more strongly dependent on temperature, with the temperature frequency being a function of a large and linear voltage slope while its relationship to voltage may be non-linear. Nevertheless, the voltage and temperature values sensed by sensor 150 may be determined as discussed by example below by solving for these quantities based on the respective frequencies of the output signals (e.g., the ring oscillator output signals).

As shown in FIG. 2, counters 160 and 162 are each coupled to register 166. Register 166 may be, for example, a shift register. Using register 166, MCC 102 (shown in FIG. 1 and described below) may input information into counters 160 and 162, and may also receive information therefrom. For example, information indicative of a run time for a counter to track a count value produced by the frequency of a correspondingly coupled sensor circuity may be input into the counters, from MCC 102, via register 166. A start indication may also be input through register 166. From counters 160 and 162, register 166 may receive the count values produced during an actual measurement. In accordance with the embodiment shown in FIG. 1, these values may be serially shifted through metrology bus 113 to MCC 102 for use in computing the voltage and temperature values. Embodiments in which register 166 is directly coupled to an implementation of MCC 102 are also possible and contemplated.

Returning to FIG. 1, in certain embodiments, IC 100 includes metrology control circuitry (MCC) 102. MCC 102 may perform various operations involved with operation of sensors 150 in the various functional circuit blocks of IC 100. In the embodiment shown, MCC 102 is coupled to each of the sensors 150 via a metrology bus 113. During operation of IC 100, each of the sensors 150 may perform readings of, e.g., a frequency of their respective ring oscillator(s), convert the frequency reading into a digital format, and transmit that information to MCC 102. In certain embodiments, MCC 102 is a serial bus, and information may be shifted on the bus in operation that is similar to that of a scan chain. However, embodiments utilizing different mechanisms for communications with sensors 150 are possible and contemplated.

MCC 102 may receive the frequency information from each of sensors 150 via their correspondingly coupled instances of metrology bus 113. Using the frequency information, MCC 102 may determine a voltage and temperature sensed by each of sensors 150. In some embodiments, MCC 102 includes service processor 111 and memory 112. Service processor 111 may execute instructions of a software routine to solve for voltage and temperature values based on frequency information received from each of the sensors 150. Embodiments in which dedicated circuitry performs these tasks in lieu of the execution of software instructions are also possible and contemplated. Memory 112 may be used by service processor to store various information, including the frequency information received from the sensors, the determined voltage and temperature information, and intermediate information generated during the performance of calculations. Memory 112 may also store information characterizing the sensors and the circuitry therein (e.g., the ring oscillators). Memory 112 may be implemented using volatile memory, non-volatile memory, or a combination thereof.

In some embodiments, MCC 102 includes an instance of sensor 120, as well as a reference sensor 107. Sensor 120 of MCC 102 is coupled to receive supply voltage Vdd5, (as are service processor 111 and memory 112). In some embodiments, sensor 120 may be configured in accordance with the other instances of sensors 150 implemented on IC 100. Reference sensor 107 may receive its supply voltage from an analog voltage supply, AVdd. In certain embodiments, reference sensor 107 is a high accuracy sensor that is less susceptible to process, voltage, and temperature variations. Temperature readings from reference sensor 107 may be used as a reference during calibrations, or may be used to determine when recalibrations may be necessary.

Example of Ring Oscillators for Voltage and Temperature Sensing

Figure 5:
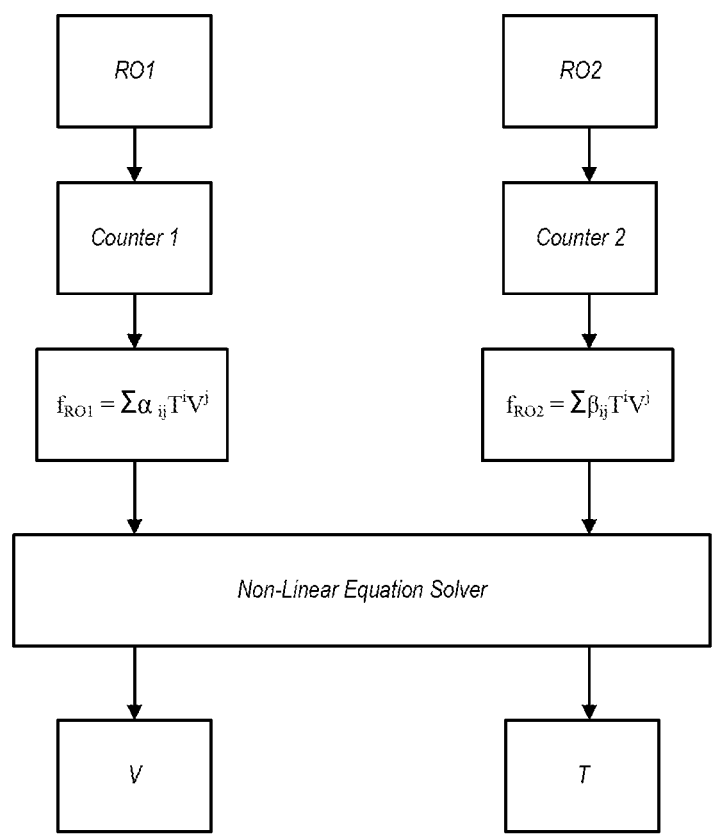
FIG. 5 is a block diagram illustrating an example of an operational concept for an embodiment of a sensor employing two ring oscillators.

FIG. 5 is a block diagram illustrating an example of an operational concept for an embodiment of a sensor employing two ring oscillators. In some embodiments, each sensor included two ring oscillators that are designed to have characteristics different from one another. More particularly, output signal frequencies of each of the ring oscillators RO1 and RO2 may have respective relationships to voltage and temperature that are different from one another. For example, the frequency of an output signal of RO1 may vary more with voltage than with temperature, while the frequency of the output signal of RO2 may vary more with temperature than with voltage. Furthermore, to provide another example, the frequency of the RO1 output signal may vary more with voltage than the frequency of the RO2 output signal, while the frequency of the RO2 output signal may vary more with temperature than that of the RO1 output signal. Generally speaking, one of the ring oscillators may be more sensitive to voltage variations with respect to the other, while the other ring oscillator may be more sensitive to temperature variations.

The two ring oscillators may be implemented in close proximity to one another, and thus may operate under substantially the same voltage and temperature conditions. However, since their characteristics are different from one another, the two ring oscillators may operate at different frequencies under the same voltage and temperature conditions. This principle may enable the determination of voltage and temperature at the sensor using frequency readings from each of the ring oscillators.

In the illustrated example, two ring oscillators, RO1 and RO2 are coupled to Counter 1 and Counter 2, respectively. In taking a reading, each ring oscillator may be allowed to toggle its respectively coupled counter for a predetermined amount of time. After the predetermined time has elapsed, the counters may be frozen and their count values provided to indicate frequency.

Each of the ring oscillators RO1 and RO2 may be characterized by a polynomial. More particularly, the frequency output by each ring oscillator may be characterized by a nonlinear function of voltage and temperature in a form given as shown in Equation 1:

$$f_{RO} = \Sigma \alpha_{ij} T^i V^j \quad (1)$$

Thus, the frequency of RO1 may be characterized as:

$$f_{RO1} = \Sigma \alpha_{ij} T^i V^j \quad (2),$$

while the frequency of RO2 may be characterized as:

$$f_{RO2} = \Sigma \beta_{ij} T^i V^j \quad (3).$$

The 'f' terms in the above equations may represent frequency, or alternatively, may represent a ratio of a product of the oscillating frequency and the number of phases to a reference frequency. The determination of the number of terms in this expression corresponding to a given ring oscillator is dependent on its characteristics. In general, a higher number of nonlinear terms increases the accuracy of representing the ring oscillator frequency with polynomials.

The output frequencies (or the product mentioned above) may be provided to a non-linear equation solver. Using the polynomials characterizing the ring oscillators, the simultaneous equations may be solved for both voltage and temperature as detected by the sensor. In one embodiment, the non-linear equation solver may be implemented using the service processor 111 (of FIG. 1) and software instructions executed thereby. More generally, the non-linear equation solver may be implemented using hardware, software, firmware, and any combination thereof. Moreover, it is possible and contemplated in some embodiments that the solving of the non-linear equations may be performed locally in the corresponding functional circuit blocks.

The coefficients in the equations above may be calculated based on actual ring oscillator frequencies for a given set of voltage and temperature values. Consider a model of a ring oscillator in which the frequency is defined using a 9-term function a set of 24 data points (voltage, temperature, and output frequency) used to calculate the ring oscillator characteristics. If a higher number of data points is used to determine coefficients, the resulting function may better characterize the corresponding ring oscillator. This technique may be referred to as surface fitting of the ring oscillator characteristic, and may use numerical techniques to map a large set of data points to a polynomial.

As an example, consider a frequency of a ring oscillator as being defined by the following expression:

$$f_{RO} = \alpha_{22}T^2V^2 + \alpha_{21}T^2V^1 + \alpha_{20}T^2V^0 + \alpha_{12}T^1V^2 + \alpha_{11}T^1V^1 + \alpha_{10}T^1V^0 + \alpha_{02}T^0V^2 + \alpha_{01}T^0V^1 + \alpha_{00}T^0V^0 \quad (4)$$

If measurements of ring oscillator frequency occur at $$\{(f_0,V_0,T_0),(f_1,V_1,T_1), \ldots ,(f_{23},V_{23},T_{23})\},$$

then the following matrices can be formed:

$$F=[f_0 f_1 \ldots f_{23}] \quad (5)$$

$$A=[\alpha_{22}\alpha_{21}\alpha_{20}\alpha_{12}\alpha_{11}\alpha_{10}\alpha_{02}\alpha_{01}\alpha_{00}] \quad (6)$$

$$X=[X_0 X_1 \ldots X_{23}],$$

in which $X_j=$
$$[T_j^2 V_j^2 T_j^2 V_j^1 T_j^2 V_j^0 T_j^1 V_j^2 T_j^1 V_j^1 T_j^1 V_j^0 T_j^0 V_j^2 T_j^0 V_j^1 T_j^0 V_j^0]^T \quad (7).$$

Accordingly, the frequency F can be defined as $F=AX$ (8). The term A can be solved for using Least Squares Estimation, computing all the coefficients in the original surface fit.

This concept can be expanded to two ring oscillators that have a different set of characteristics by characterizing each as described above. Accordingly, two ring oscillators placed in close proximity to one another, receiving the same supply voltage, and operating at substantially the same local temperature, can be characterized in two expressions as follows:

$$\begin{cases} f_{RO1} = \sum_{i,j} \alpha_{ij} T^i V^j \\ f_{RO2} = \sum_{i,j} \beta_{ij} T^i V^j \end{cases} \quad (9)$$

The above assumes that the two ring oscillators are characterized with polynomials having equal lengths, although this is not necessarily required for all instances.

The complexity of solving the simultaneous equations above may be reduced using a piecewise linear (PWL) technique. Using this technique, a two-dimensional nonlinear surface for the output frequency of a ring oscillator can be described using a set of PWL functions. The surface of operation over an entire voltage and temperature can be split into multiple triangular regions over each of which the characteristics of a corresponding can be described using a linear function of voltage and temperature. Thus, the overall surface may be broken into an integer number n of PWL regions, described as follows:

$$f = \begin{cases} a_{T1}T + a_{V1}V + a_{C1} & \text{for region 1} \\ a_{T2}T + a_{V2}V + a_{C2} & \text{for region 2} \\ \vdots \\ a_{Tn}T + a_{Vn}V + a_{Cn} & \text{for region } n \end{cases} \quad (10)$$

The coefficients for each of the PWL functions can be determined using the output frequencies at the three vertices of the triangle describing any given area. For example, for PWL function describing a triangle extending between temperatures T1 and T2 on a first axis and a voltages V1 and V2 on a second axis, with the frequencies measured at $(T_1, V_1)$, $(T_1, V_2)$, and $(T_2, V_1)$ respectively given by $f_1$, $f_2$, and $f_3$ and the index for the PWL is given as i, the following set of equations can be solved in order to compute the coefficients for the corresponding PWL function in that area:

$$\begin{cases} f_1 = a_{Ti}T_1 + a_{Vi}V_1 + a_{Ci} \\ f_2 = a_{Ti}T_1 + a_{Vi}V_2 + a_{Ci} \\ f_3 = a_{Ti}T_2 + a_{Vi}V_1 + a_{Ci} \end{cases} \quad (11)$$

This can be repeated for every region to determine its PWL characteristic, and thus to determine the surface of operation for the ring oscillator:

$$f_{RO} = \alpha_{22}T^2V^2 + \alpha_{21}T^2V^1 + \alpha_{20}T^2V^0 + \alpha_{12}T^1V^2 + \alpha_{11}T^1V^1 + \alpha_{10}T^1V^0 + \alpha_{02}T^0V^2 + \alpha_{01}T^0V^1 + \alpha_{00}T^0V^0.$$

Once both ring oscillators have been characterized with a set of PWL function, solving the set of nonlinear equations is reduced to solving a set of PWL equations. The equations to be solved for each PWL computation may be generally described as follows:

$$\begin{cases} f_{RO1} = a_{Ti}T + a_{Vi}V + a_{Ci} \\ f_{RO2} = b_{Ti}T + b_{Vi}V + b_{Ci} \end{cases} \quad (12)$$

Solving these two equations for temperature, T, and voltage, V, results in the following:

$$\begin{cases} T = \dfrac{(f_{RO1}-a_{Ci})b_{Vi} - (f_{RO2}-b_{Ci})a_{Vi}}{a_{Ti}b_{Vi} - b_{Ti}a_{Vi}} = f_{RO1}\left(\dfrac{b_{Vi}}{a_{Ti}b_{Vi} - b_{Ti}a_{Vi}}\right) + f_{RO2}\left(\dfrac{-a_{Vi}}{a_{Ti}b_{Vi} - b_{Ti}a_{Vi}}\right) + \left(\dfrac{a_{Vi}b_{Ci} - b_{Vi}a_{Ci}}{a_{Ti}b_{Vi} - b_{Ti}a_{Vi}}\right) \\ V = -\dfrac{(f_{RO1}-a_{Ci})b_{Ti} - (f_{RO2}-b_{Ci})a_{Ti}}{a_{Ti}b_{Vi} - b_{Ti}a_{Vi}} = f_{RO1}\left(\dfrac{-b_{Ti}}{a_{Ti}b_{Vi} - b_{Ti}a_{Vi}}\right) + f_{RO2}\left(\dfrac{a_{Ti}}{a_{Ti}b_{Vi} - b_{Ti}a_{Vi}}\right) + \left(-\dfrac{a_{Vi}b_{Ci} - b_{Ti}a_{Ci}}{a_{Ti}b_{Vi} - b_{Ti}a_{Vi}}\right) \end{cases} \quad (13), (14)$$

As previously noted, the calculations discussed herein may be performed in MCC 102, and particularly in service processor 111. This may allow each sensor 150 to be implemented in a small area and limit its power consumption, since it need not perform any conversion of frequency to voltage and/or temperature. More generally, the features used for frequency measurement may be implemented within each sensor 150, while those features used for PWL computation, calibration against process variation, again, and accuracy may be implemented within MCC 102.

A surface fit of each ring oscillator (and thus its respective PWL representation) may change over each process corner and may also be subject to local on-die variations. Moreover, the accuracy of a given ring oscillator may be reduced due to effects such as aging. Accordingly, a calibration scheme used for such ring oscillators may update the characteristics of each. These characteristics may be updated based on a limited set of accurate measurements from each ring oscillator. If an original (but not accurate) model for a given ring oscillator is $$f_{RO\_precal} = \Sigma_{i,j}\alpha_{ij}T^i V^j \quad (15),$$

a set of actual measurements may be performed to update the coefficients such that a more accurate model of the ring oscillator is as follows:

$$f_{RO\_postcal} = \Sigma_{i,j} \alpha_{ij} * T^i V^j \quad (16).$$

This calibration factors in both the original model and a set of calibration points. As the number of points increases, the accuracy increases correspondingly. Conversely, the efficiency of a calibration algorithm may be determined by the accuracy of the post-calibration model based on a smallest number of data points.

In one embodiment, a calibration algorithm in accordance with the disclosure includes updating the coefficients using a scaled value of the error signal at any calibration point. For any of the calibration points, the error signal (e) may be defined as the difference between the actual measurement and the value predicted by the model. That means $\forall k \in \{1, 2, \ldots, m\}$:

$$e_k = f_k - \Sigma_{i,j} \alpha_{ij} T_k^i V_k^j \quad (17).$$

If the coefficients in the original model ($a_{ij}$) are consolidated in a vector given as $A_0$, a recursive approach may be utilized in which the vector is updated for every single calibration point:

$$A_k = A_{k-1} + e_k G \quad (18).$$

In one embodiment, the G vector may be determined using the Recursive Least Squares (RLS) technique. This may in turn result in a relatively fast convergence to final desired values based on a limited set of calibration data. In using the RLS technique, the G vector is recursively updated during each step. The RLS technique may utilize an alternate characterization of a ring oscillator as follows:

$$f_{RO_{precal}} = A_0 U^T \quad (19),$$

wherein U is a vector of the (i+1)(j+1) terms, i.e.:

$$U = [T^i V^j T^{i-1} V^j \ldots T^0 V^0] \quad (20).$$

From this, a diagonal matrix may be formed:

$$P_0 = \begin{bmatrix} \text{var}(U(1))^{-1} & 0 & \ldots & 0 \\ 0 & \text{var}(U(2))^{-1} & & \vdots \\ \vdots & & \ddots & \vdots \\ 0 & & \ldots & dc \end{bmatrix} \quad (21)$$

For any calibration point, the following set of computations may be performed:

$$\begin{cases} r_k = \lambda + U P_{k-1} U^T \\ G_k = \frac{1}{r_k} P_{k-1} U^T \\ A_k = A_{k-1} + e_k G_k \\ P_k = \frac{1}{\lambda} P_{k-1} - \frac{1}{\lambda} G_k U P_{k-1} \end{cases} \quad (22)$$

wherein $\lambda$ is a forgetting factor, and e is the error.

Accordingly, using a recursive least squares algorithm, such as that described above, the coefficients for a polynomial characterizing a ring oscillator may be updated during a calibration procedure. Such calibrations may be performed at various times, such as on a system startup, at selected times during the life of the system/IC, responsive to large variations in reference sensor 107 and sensor 120 in MCC 105, and so forth. As such, voltage and temperature, based on ring oscillator frequencies, may be determined with a reasonable level of accuracy over the life of the system, while enabling the use of simple sensors having a small area footprint.

Example Method

FIG. 6 is a flow diagram illustrating a method for determining a voltage and a temperature from a sensor, according to some embodiments. Method 600 may be implemented using any of the embodiments of a sensor circuit as disclosed herein, in conjunction with any circuitry or other mechanism to solve for voltage and temperature based on respective ring oscillator frequencies.

At 602, in the illustrated embodiment, a first supply voltage from a first digital power supply is received at a first sensor circuit where the first digital power supply provides the first supply voltage at a supply voltage with a magnitude in a limited range and where the first sensor circuit produces an output signal responsive to a value of a first local operating property. In some embodiments, the first digital power supply provides the first supply voltage at a substantially fixed supply voltage magnitude. In some embodiments, the first sensor circuit includes a ring oscillator coupled to the first digital power supply where the ring oscillator provides the output signal responsive to the value of the first local operating property and where the first counter determines the first value based on a frequency of the shifted output signal received from the ring oscillator in the first sensor circuit. In some embodiments, the first supply voltage from the first digital power supply is received at a second sensor circuit where the second sensor circuit produces a second output signal responsive to a value of a second local operating property and where the second local operating property is different from the first local operating property.

At 604, in the illustrated embodiment, a level of the output signal is shifted using a first level shifter coupled to the first sensor circuit where the shifted output signal is shifted corresponding to a second supply voltage provided by a second digital power supply.

At 606, in the illustrated embodiment, the shifted output signal is received at a first counter coupled to the first level shifter.

At 608, in the illustrated embodiment, a first value representing the shifted output signal is determined by the first counter. In some embodiments, a first value from the first counter is received in a shift register coupled to the first counter.

In some embodiments, the second supply voltage is received at a ring oscillator coupled to the second digital power supply, a local aging property is assessed at the ring oscillator, and an output signal corresponding to the first counter is provided from the ring oscillator where the output signal corresponds to the local aging property.

Example Computer System

Figure 7:
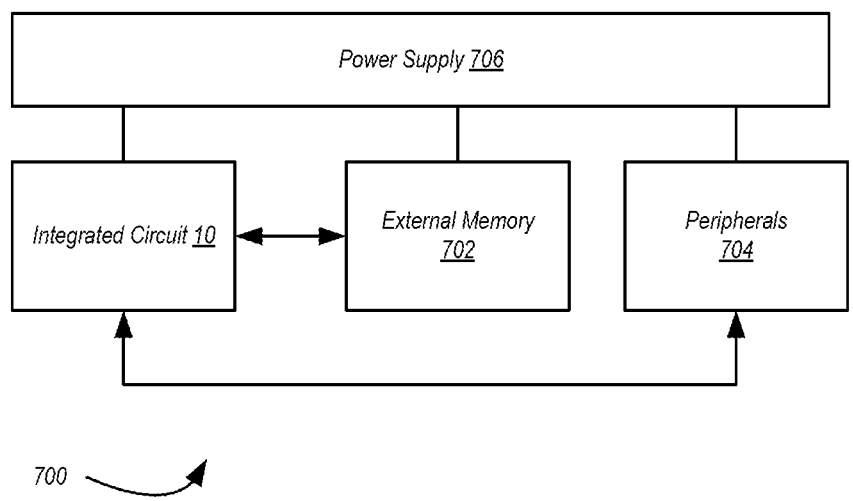
FIG. 7 is a block diagram of one embodiment of an example system.

Turning next to FIG. 7, a block diagram of one embodiment of a system 700 is shown. In the illustrated embodiment, the system 700 includes at least one instance of an integrated circuit 100 coupled to external memory 702. The integrated circuit 100 may include a memory controller that is coupled to the external memory 702. The integrated circuit 100 is coupled to one or more peripherals 704 and the external memory 702. A power supply 706 is also provided which supplies the supply voltages to the integrated circuit 100 as well as one or more supply voltages to the memory 702 and/or the peripherals 704. In some embodiments, more than one instance of the integrated circuit 100 may be included (and more than one external memory 702 may be included as well).

The peripherals 704 may include any desired circuitry, depending on the type of system 700. For example, in one embodiment, the system 700 may be a mobile device (e.g. personal digital assistant (PDA), smart phone, etc.) and the peripherals 704 may include devices for various types of wireless communication, such as WiFi, Bluetooth, cellular, global positioning system, etc. The peripherals 704 may also include additional storage, including RAM storage, solid-state storage, or disk storage. The peripherals 704 may include user interface devices such as a display screen, including touch display screens or multitouch display screens, keyboard or other input devices, microphones, speakers, etc. In other embodiments, the system 700 may be any type of computing system (e.g. desktop personal computer, laptop, workstation, tablet, etc.).

The external memory 702 may include any type of memory. For example, the external memory 702 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 702 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A circuit, comprising:
    a first digital power supply that provides a first supply voltage to first digital functional circuitry during use, wherein the first supply voltage is determined based on one or more properties of the first digital functional circuitry;
    a second digital power supply, wherein the second digital power supply provides a second supply voltage to second digital functional circuitry, the second supply voltage having a magnitude that remains above a minimum voltage magnitude during use;
    a first circuit configured to assess one or more local operating properties, wherein the first circuit includes:
        a first sensor circuit coupled to the second digital power supply, wherein the first sensor circuit is configured to provide an output signal responsive to a value of a first local operating property of the first digital functional circuitry;
        a first level shifter coupled to the first sensor circuit, the first level shifter being configured to receive the output signal from the first sensor circuit and provide a first shifted output signal corresponding to the first supply voltage; and
        a first counter coupled to the first level shifter, wherein the first counter is configured to receive the first shifted output signal and capture a first value representing the first shifted output signal.

2. The circuit of claim 1, wherein the minimum voltage magnitude for the second supply voltage is above the first supply voltage during use.

3. The circuit of claim 1, wherein the minimum voltage magnitude for the second supply voltage is selected to provide a predetermined accuracy for the first circuit in assessing the one or more local operating properties.

4. The circuit of claim 1, wherein the second supply voltage varies at most by about ±10%.

5. The circuit of claim 1, wherein the second supply voltage has a substantially fixed magnitude.

6. The circuit of claim 1, wherein the first supply voltage varies based on one or more operating properties of the first digital functional circuitry.

7. The circuit of claim 1, wherein the first supply voltage is determined based on binning of the first digital functional circuitry.

8. The circuit of claim 1, wherein the first supply voltage is varied based on dynamic voltage and frequency management of the first digital functional circuitry.

9. The circuit of claim 1, further comprising a shift register coupled to receive the first value from the first counter.

10. The circuit of claim 1, wherein the first sensor circuit includes a ring oscillator coupled to the second digital power supply, the ring oscillator being configured to provide the output signal responsive to the value of the first local operating property.

11. The circuit of claim 1, wherein the first circuit comprises a second sensor circuit coupled to the second digital power supply, wherein the second sensor circuit is configured to provide an output signal responsive to a value of a second local operating property of the first digital functional circuitry, and wherein the second local operating property is different from the first local operating property.

12. A method comprising:
    receiving, at a first sensor circuit, a first supply voltage from a first digital power supply, wherein the first digital power supply provides the first supply voltage at a supply voltage having a magnitude that remains above a minimum voltage magnitude, and wherein the first sensor circuit produces an output signal responsive to a value of a first local operating property of a second digital functional circuitry coupled to the first sensor circuit;
    shifting a level of the output signal using a first level shifter coupled to the first sensor circuit, wherein the shifted output signal is shifted corresponding to a second supply voltage provided by a second digital power supply coupled to the second digital functional circuitry, the second supply voltage being determined based on one or more properties of the first digital functional circuitry;

receiving, at a first counter coupled to the first level shifter, the shifted output signal; and determining, by the first counter, a first value representing the shifted output signal.

13. The method of claim 12, wherein the minimum voltage magnitude for the first supply voltage is above the second supply voltage during use.

14. The method of claim 12, further comprising determining the minimum voltage magnitude for the second supply voltage based on a desired accuracy for the first sensor circuit in assessing the value of the first local operating property.

15. The method of claim 12, further comprising:
receiving, at a second sensor circuit, the first supply voltage from the first digital power supply, wherein the second sensor circuit produces a second output signal responsive to a value of a second local operating property of the second digital functional circuitry, and wherein the second local operating property is different from the first local operating property.

16. The method of claim 12, further comprising determining the second supply voltage based on binning of the second digital functional circuitry.

17. The method of claim 12, further comprising determining the second supply voltage based on dynamic voltage and frequency management of the second digital functional circuitry.

18. An integrated circuit, comprising:
a plurality of functional circuit blocks each including functional circuitry;
a first digital power supply that provides a first supply voltage during use;
a second digital power supply, wherein the second digital power supply provides a second supply voltage to second digital functional circuitry, the second supply voltage having a magnitude that remains above a minimum voltage magnitude during use; and
a plurality of sensors, wherein each of the plurality of functional circuit blocks includes at least one of the plurality of sensors implemented therein, and wherein at least one of the plurality of sensors includes:
a first sensor circuit coupled to the second digital power supply, wherein the first sensor circuit is configured to provide an output signal responsive to a value of a first local operating property;
a first level shifter coupled to the first sensor circuit, the first level shifter being configured to receive the output signal from the first sensor circuit and provide a first shifted output signal corresponding to the first supply voltage;
a first counter coupled to the first level shifter, wherein the first counter is configured to receive the first shifted output signal and capture a first value representing the first shifted output signal;
a second sensor circuit coupled to the second digital power supply, wherein the second sensor circuit is configured to provide an output signal responsive to a value of a second local operating property, and wherein the second local operating property is different from the first local operating property;
a second level shifter coupled to the second sensor circuit, the second level shifter configured to receive the output signal from the second sensor circuit and provide a second shifted output signal corresponding to the first supply voltage;
a second counter coupled to the second level shifter, wherein the second counter is configured to receive the second shifted output signal and capture a second value representing the second shifted output signal.

19. The integrated circuit of claim 18, wherein, for at least one of the plurality of sensors, the first local operating property is an operating voltage of at least one functional circuit block, and wherein the second local operating property is a temperature of the at least one functional circuit block.

20. The integrated circuit of claim 18, wherein the minimum voltage magnitude for the second supply voltage is above the first supply voltage during use.

* * * * *